United States Patent [19]
Hertrich

[11] Patent Number: 5,418,394
[45] Date of Patent: May 23, 1995

[54] POWER MOSFET WITH IMPROVED AVALANCHE RESISTANCE

[75] Inventor: Helmut Hertrich, Fahrenzhausen-Weng, Germany

[73] Assignee: Siemens Aktiengesellschaft, Munich, Germany

[21] Appl. No.: 104,670

[22] Filed: Aug. 10, 1993

[30] Foreign Application Priority Data

Aug. 10, 1992 [EP] European Pat. Off. ............ 92113628

[51] Int. Cl.$^6$ ..................... H01L 29/784; H01L 29/91
[52] U.S. Cl. ..................... 257/401; 257/139; 257/490
[58] Field of Search ............... 257/401, 402, 138, 139, 257/400, 490

[56] References Cited

U.S. PATENT DOCUMENTS

| | | | |
|---|---|---|---|
| 5,008,725 | 4/1991 | Lidow et al. | 257/401 |
| 5,045,903 | 9/1991 | Meyer et al. | 257/339 |
| 5,047,813 | 9/1991 | Harada | 257/139 |

FOREIGN PATENT DOCUMENTS

| | | |
|---|---|---|
| 0293846 | 12/1988 | European Pat. Off. . |
| 0466508 | 1/1992 | European Pat. Off. . |
| 2082534 | 3/1990 | Japan . |
| 2240427 | 7/1991 | United Kingdom . |

OTHER PUBLICATIONS

European Search Report.

*Primary Examiner*—Rolf Hille
*Assistant Examiner*—Wael M. Fahmy
*Attorney, Agent, or Firm*—Herbert L. Lerner; Laurence A. Greenberg

[57] ABSTRACT

A power MOSFET with improved avalanche resistance has a cell field in which the lateral cells are provided with source zones which are partly omitted or of a reduced size. The avalanche resistance is further improved in terms of reduced manufacturing cost in that a p-doped annular zone is disposed between the cell field and the edge of the semiconductor body. An annular trench is formed in the annular zone. The annular trench is contacted with the source metallization. The annular zone and the annular trench have the same depth as the gate zones of the cells and/or as the source contact holes.

6 Claims, 2 Drawing Sheets

POWER MOSFET WITH IMPROVED AVALANCHE RESISTANCE

BACKGROUND OF THE INVENTION

1. Field of the Invention

The invention relates to a power MOSFET having a plurality of cells connected in parallel disposed on a semiconductor body; each of the cells comprises a gate zone and a source zone embedded in planar fashion in the gate zone; the assembly has a metallization layer that contacts the gate zones through contact holes formed in the source zones, and gate electrodes that are connected in parallel.

2. Description of the Related Art

A power MOSFET of this general kind has been described in European published patent application 0 293 846 A1, for example. In that teaching, the object is to increase the avalanche current, which typically flows at the edge of the cell field, without turning on the parasitic bipolar transistor and thereby destroying the transistor. It was proposed in the European document to produce a source zone which would help avoid damage due to overload, and more specifically to provide the cells of the cell field adjacent the edge without a source zone or with a source zone of decreased size.

Since power MOSFETs in general are manufactured by a self-aligning technique, in that the gate electrodes form the implantation mask for both the gate and the source zones, that prior art semiconductor component requires one additional mask.

SUMMARY OF THE INVENTION

It is accordingly an object of the invention to provide a power MOSFET with improved avalanche resistance, which overcomes the hereinafore-mentioned disadvantages of the heretofore-known devices of this general type and which, as compared to the prior art, further increases the avalanche resistance while simplifying the manufacturing process. It is a further object to increase the commutation resistance of the device.

With the foregoing and other objects in view there is provided, in accordance with the invention, a power MOSFET, comprising:

a semiconductor body having an edge, a plurality of cells disposed on the semiconductor body and being connected in parallel, each of the cells including a gate zone and a source zone embedded in planar fashion in the gate zone; the source zones having a given source conductivity and having contact holes of a given contact hole depth formed therein; the gate zones having a given conductivity type, a given depth and a given doping; a metallization layer contacting the gate zones through the contact holes formed in the source zones; gate electrodes being mutually connected in parallel; an annular zone formed in the semiconductor body between the cells and the edge of the semiconductor body, the annular zone having the given conductivity type; the annular zone having the given depth and the given doping of the gate zones; the annular zone having an annular trench formed therein; the annular trench being contacted with the metallization layer and having a depth corresponding to the given contact hole depth; and the annular trench defining an outer volume of the annular zone located between the annular trench and the edge of the semiconductor body, the outer volume being free of zones having a conductivity type corresponding to the source conductivity.

In rewording the foregoing, the primary novel features of the invention reside in the follows:
a) between the cells and the edge of the semiconductor body, there is an annular zone of the same conductivity type as the gate zones;
b) the annular zone has the same depth and doping as the gate zones;
c) the annular zone has an annular trench with the same depth as the contact holes;
d) the annular trench is contacted by the metallization layer; and
e) the volume of the annular zone located between the trench and the edge of the semiconductor body is free of zones corresponding to the conductivity type of the source zones.

In accordance with an added feature of the invention, the power MOSFET includes an insulating layer covering the semiconductor body, the insulating layer extending between the annular trench and the edge of the semiconductor body, and wherein the annular zone has an proximal wall and a distal wall as seen from the edge of the semiconductor body, the metallization layer protruding beyond the proximal wall of the annular zone.

In accordance with another feature of the invention, the power MOSFET includes a conductive layer disposed on the insulating layer and extending between the annular trench and the edge of the semiconductor body, the metallization layer contacting the conductive layer.

In accordance with a further feature of the invention, the gate zones are formed of a given material and have a given thickness, the conductive layer is formed of the given material and has the given thickness.

In accordance with a concomitant feature of the invention, the power MOSFET includes at least one further source zone disposed in the annular zone between the annular trench and the cells.

Other features which are considered as characteristic for the invention are set forth in the appended claims.

Although the invention is illustrated and described herein as embodied in a power MOSFET with increased avalanche resistance, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS

Figure 1:
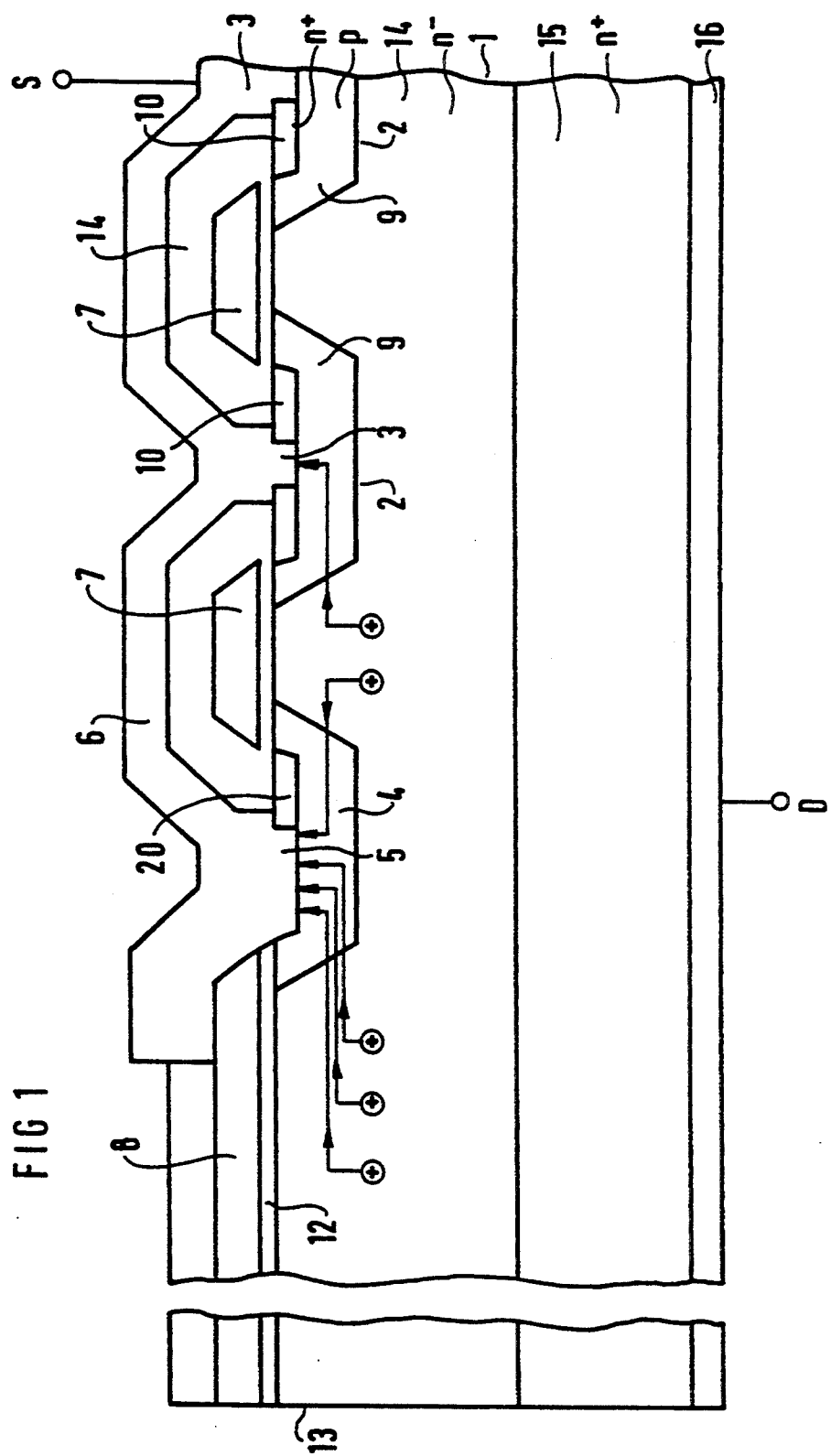
FIG. 1 is a diagrammatic cross-sectional view through a power FET according to the invention.

Referring now to the figures of the drawing in detail and first, particularly, to FIG. 1 thereof, there is seen a power FET with a semiconductor body 1. A weakly n-doped zone 14 is applied over a strongly n-doped substrate 15. Transistor cells 2 are embedded in the weakly n-doped layer 14. The transistor cells 2 have p-doped gate zones 9, in which strongly n-doped source zones 10 are embedded. Located between the cells 2 and an edge 13 of the semiconductor body 1 is an annular zone 4, which surrounds the cell field formed by all the cells 2 of the power FET. The annular zone 4 has the same doping and the same depth as the gate zones 9. The wall of the zone 4 shown on the left in FIG. 1 will be referred to as a proximal wall and the edge shown on the right will be referred to as a distal wall, as seen in relation with the edge 13 of the semiconductor. The gate zones 9 are contacted by a metal layer or metallization layer 6 through contact holes 3 provided in the source zones 10. The metallization layer 6 also contacts the source zones 10 and it is provided with a source terminal S. The substrate 15 is connected to a drain terminal D via an electrode 16.

The annular zone 4 has an annular trench 5, which has the same depth as the contact holes 3. The annular zone 4 is contacted through the metallization layer 6 in the trench 5.

Gate electrodes 7 are disposed above the cells 2 in a known manner. They are used as a mask for the implantation of the gate zones 9 and source zones 10. Between the annular zone 4 and the edge 13, the semiconductor body is covered with an insulating film 12, on which a conductive layer 8 is disposed. The conductive layer 8 is preferably formed from the same material as the gate electrodes 7, for instance doped polysilicon. It is produced simultaneously with the electrodes 7 and it has an obliquely inclined side wall. Together with the gate electrode 7 closest to the edge 13, the layer 8 serves as a mask for producing the annular zone 4. Together with the source zones 10 in the cells 2, a source zone 20 is initially produced in the zone 4 as well.

The annular trench 5 in the annular zone 4 is disposed such that the zone 20 located toward the edge 13 is removed from the volume of the annular zone 4.

If a blocking bias or blocking voltage is applied to the transistor via the source terminal S and the drain terminal D, then a space charge zone builds up at the p-n junctions between the zones 9 and 14. If the voltage is increased, then the avalanche breakdown occurs upon attainment of the critical threshold field intensity $E_{crit}$. As experience has shown, the avalanche breakdown occurs especially in the vicinity of the edge of the power FET. This produces charge carrier pairs, of which the negative charge carriers flow to the drain electrode D and the positive charge carriers flow to the source electrode S. The charge carrier pairs produced at the edge of the semiconductor body flow into the annular zone 4 and from there they flow to the metallization layer 6. The remaining, laterally flowing avalanche current below the source zones 10 and the source zone 20 becomes so small as a result that no emission of charge carriers from the source zones 10 and 20 occurs. This means that the parasitic bipolar transistor cannot turn on.

The power FET described can be produced very easily without any additional mask. Because the annular trench 5 has the same depth as the contact holes 3, it can be etched simultaneously with them. The etching mask required in any case to produce the contact holes 3 is expanded for that purpose such that the source zone 20 implanted into the annular zone 4 is at least partially etched away. The resultant annular trench is configured such that the source zone 20 is etched away completely on that side of the trench facing toward the edge 13. On that side of the annular trench 5 which is disposed remote from the edge 13, i.e. at the distal wall, a part of the source zone 20 may remain.

Figure 2:
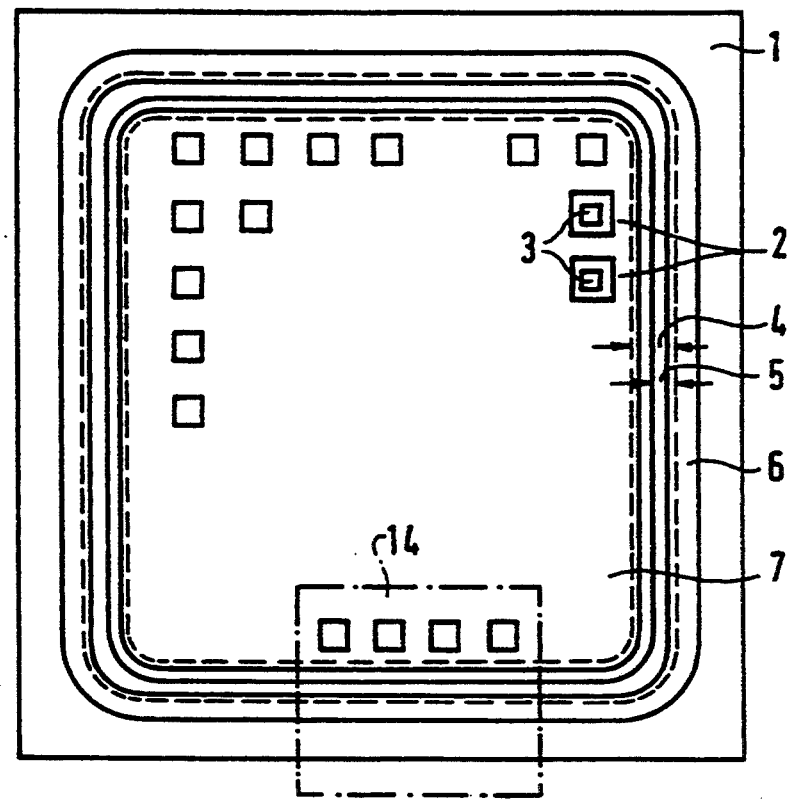
FIG. 2 is a simplified top-plan view of the configuration of FIG. 1.

FIG. 2 illustrates the configuration of FIG. 1 in a rather simplified view. Like parts are thereby referenced with the same reference numerals. The metallization layer 6 above the cell field has been left out of that figure, so as to make the gate electrodes 7 for the individual cells 2 visible. The gate electrodes 7 are formed by a continuous layer of polysilicon. In FIG. 1, only that part of the metallization 6 is shown which contacts the annular trench 5.

Figure 3:
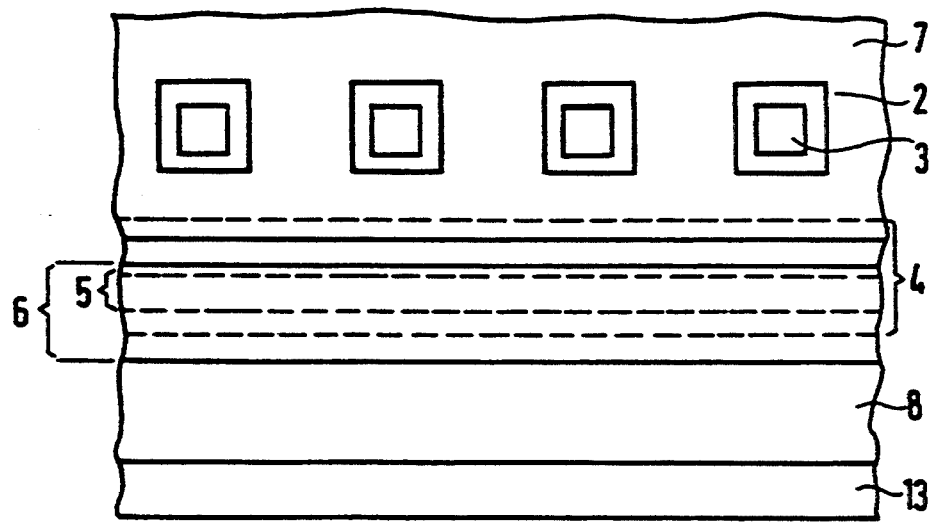
FIG. 3 is a partial, enlarged view of a detail of FIG. 2 outlined with the dashed-dotted line 14.

Referring now to the detail view of FIG. 3, it can be clearly seen that the layer of the gate electrodes 7 covers the annular zone 4. The annular trench 5 is disposed inside the annular zone 4 and it is completely covered by the metallization layer 6. The metallization layer 6 contacts the conductive layer 8. No electrically conductive connection exists between the conductive layer 8 and the gate electrodes 7. Instead, the conductive layer 8 above the metallization layer 6 lies at source potential and hence acts as a magnetoresistor or a field plate.

I claim:

1. A power MOSFET, comprising:
a semiconductor body having an edge, a plurality of cells disposed on said semiconductor body and being connected in parallel, each of said cells including a gate zone and a source zone embedded in planar fashion in said gate zone;
said source zones having contact holes of a given contact hole depth formed therein; said gate zones having a given conductivity type, a given depth and a given doping concentration;
a metallization layer contacting said gate zones through said contact holes formed in said source zones;
gate electrodes being mutually connected in parallel;
an annular zone formed in said semiconductor body between said cells and said edge of said semiconductor body, said annular zone having said given conductivity type;
said annular zone having said given depth and said given doping concentration of said gate zones;
said annular zone having an annular trench formed therein;
said annular trench being contacted with said metallization layer and having a depth corresponding to said given contact hole depth; and
said annular zone having at least one further annular zone disposed in said annular trench at a side thereof facing away from said edge of said semiconductor body, said at least one further annular zone having a conductivity type corresponding to a conductivity type of said source zones and having the same depth and the same doping concentration as said source zones; an insulating layer covering said semiconductor body between said annular trench and said edge of said semiconductor body, and a conducting layer covering said insulating layer, said conducting layer being formed from the same material as said gate electrodes.

2. The power MOSFET according to claim 1, wherein said insulating layer is an insulating film covering said semiconductor body, said insulating film extending between said annular trench and said edge of said semiconductor body, and wherein said annular zone has a proximal wall and a distal wall with regard to said edge of said semiconductor body, said metallization layer protruding beyond said proximal wall of said annular zone.

3. The power MOSFET according to claim 2, wherein said conductive layer extends between said annular trench and said edge of said semiconductor body, said metallization layer contacting said conductive layer.

4. The power MOSFET according to claim 3, wherein said gate zones are formed of a given material and have a given thickness, said conductive layer being formed of said given material and having said given thickness.

5. The power MOSFET according to claim 1, including at least one further source zone disposed in said annular zone between said annular trench and said cells.

6. The power MOSFET according to claim 4, including at least one further source zone disposed in said annular zone between said annular trench and said cells.

* * * * *